US012777573B2

(12) United States Patent
Zhao et al.

(10) Patent No.: US 12,777,573 B2
(45) Date of Patent: Oct. 27, 2026

(54) SLOT GROUND FOR IMPROVED SIGNAL INTEGRITY

(71) Applicant: NVIDIA Corporation, Santa Clara, CA (US)

(72) Inventors: Tibet Zhao, LongHua Town (CN); Baal Yang, LongHua Town (CN); Yongwei Chen, LongHua Town (CN)

(73) Assignee: NVIDIA Corporation, Santa Clara, CA (US)

( * ) Notice: Subject to any disclaimer, the term of this patent is extended or adjusted under 35 U.S.C. 154(b) by 126 days.

(21) Appl. No.: 18/390,351

(22) Filed: Dec. 20, 2023

(65) Prior Publication Data

US 2025/0212317 A1 Jun. 26, 2025

(51) Int. Cl.
*H05K 1/02* (2006.01)
*H05K 1/11* (2006.01)
*H05K 3/00* (2006.01)
*H05K 3/42* (2006.01)

(52) U.S. Cl.
CPC ........... *H05K 1/0222* (2013.01); *H05K 1/113* (2013.01); *H05K 1/115* (2013.01); *H05K 3/0047* (2013.01); *H05K 3/421* (2013.01); *H05K 2201/0723* (2013.01); *H05K 2201/09518* (2013.01)

(58) Field of Classification Search
CPC ........ H05K 1/113; H05K 1/115; H05K 1/116; H05K 1/0222–0245; H05K 2201/09454; H05K 2201/09518; H05K 2201/0959; H05K 2201/09545; H05K 2201/09581; H05K 2201/09627; H05K 2201/09636; H05K 2201/09809; H05K 2201/0723; H05K 2201/09854; H05K 1/0251; H01P 3/08; H01P 1/047
See application file for complete search history.

(56) References Cited

U.S. PATENT DOCUMENTS

| | | | | |
|---|---|---|---|---|
| 8,354,601 | B2 | 1/2013 | Russell | |
| 10,470,311 | B2 * | 11/2019 | Twarog | H05K 3/4038 |
| 2005/0146390 | A1 * | 7/2005 | Baek | H05K 1/116 333/33 |
| 2005/0247482 | A1 * | 11/2005 | Nakamura | H05K 1/115 174/262 |
| 2009/0133913 | A1 | 5/2009 | Kushta et al. | |
| 2012/0119853 | A1 | 5/2012 | Kushta | |
| 2012/0187550 | A1 * | 7/2012 | Wu | H05K 1/0222 257/659 |
| 2018/0184522 | A1 * | 6/2018 | Rodriguez | H05K 1/0222 |
| 2019/0159333 | A1 | 5/2019 | Sinha et al. | |
| 2021/0190825 | A1 | 6/2021 | Brecht | |
| 2022/0015225 | A1 * | 1/2022 | Sinha | H05K 1/0221 |
| 2022/0369452 | A1 * | 11/2022 | Pritchard | H05K 1/0222 |
| 2022/0418094 | A1 * | 12/2022 | Nitta | H05K 9/00 |
| 2023/0019563 | A1 * | 1/2023 | Nitta | H01P 3/08 |

* cited by examiner

*Primary Examiner* — Roshn K Varghese
(74) *Attorney, Agent, or Firm* — Lowenstein Sandler LLP

(57) ABSTRACT

A device includes a printed circuit board (PCB) including a signal trace electrically coupled to a signal via. The device further includes a slot ground configured to reduce signal interference with respect to the signal via. The slot ground includes a slot formed in the PCB at least partially surrounding the signal via. The slot ground further includes metal plating on a wall of the slot. The metal plating is electrically coupled to a ground plane of the PCB. The slot ground further includes resin at least partially filling the slot.

13 Claims, 16 Drawing Sheets

500B

SLOT GROUND FOR IMPROVED SIGNAL INTEGRITY

TECHNICAL FIELD

At least one embodiment pertains to printed circuit board (PCB) fabrication. For example, at least one embodiment pertains to technology for implementing slot grounds for improved signal integrity.

BACKGROUND

A printed circuit board (PCB) can be used to connect electronic components. A PCB can include multiple conductive layers. The conductive layers can include at least a top layer and a bottom layer. The conductive layers can further include one or more layers disposed between the top layer and the bottom layer. In such PCBs, the top layer and the bottom layer can be referred to as "exterior layers" and each additional layer can be referred to as an "interior layer." A PCB can include one or more vias that enable respective interconnections between conductive traces on the different layers. More particularly, a via can be formed by forming a hole that traverses through at least two adjacent conductive layers, and plating the hole with a conductive material that forms an electrical connection so that the conductive traces on different layers are electrically connected.

Crosstalk is a phenomenon where electrical signals on one trace and/or via unintentionally interfere with or affect the signals on nearby traces and/or vias. This interference can lead to signal degradation, data errors, or other performance issues in the associated electronic circuits. Crosstalk occurs due to electromagnetic coupling between traces and/or vias in close proximity, and it can be particularly problematic at high data transmission frequencies or in densely populated PCBs.

BRIEF DESCRIPTION OF DRAWINGS

Various embodiments in accordance with the present disclosure will be described with reference to the drawings, in which.

DETAILED DESCRIPTION

Figure 1A:
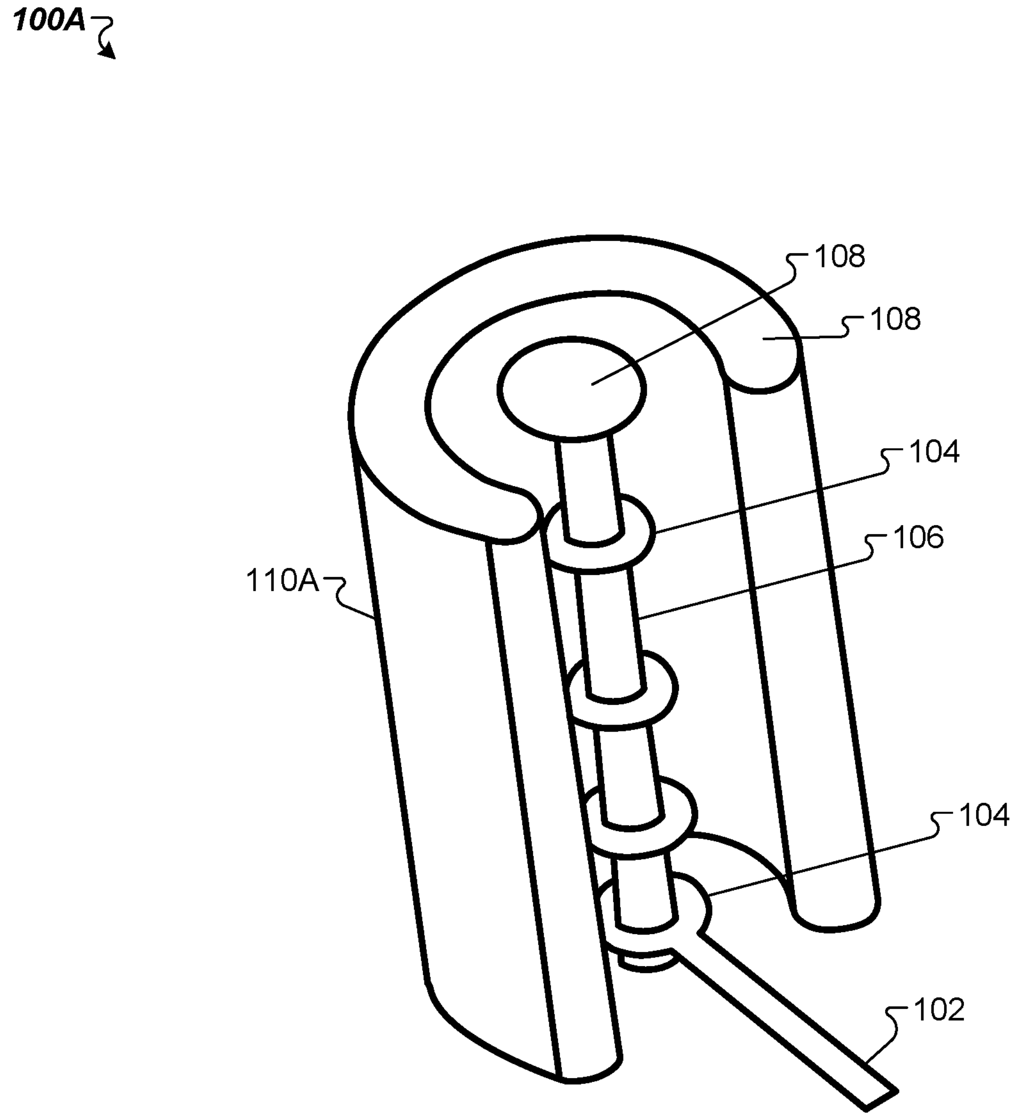
FIGS. 1A-1B are perspective views of example slot grounds, in accordance with at least some embodiments.

As described above, A PCB can further include at least one via. A via is a plated hole that passes through multiple layers of a PCB to make electrical connections between different layers of the PCB.

One example of a via is a through-hole via. A through-hole via extends through all layers of a PCB, connecting the top and bottom layers, as well as any interior layers. Accordingly, through-hole vias are visible from both sides of the PCB. Another example of a via is a blind via. A blind via refers to a via that connects an exterior layer of a PCB (e.g., the top layer or the bottom layer) to one or more interiors layer of the PCB. Accordingly, blind vias are only visible from one side of the PCB. A further example of a via is a buried via. A buried via refers to a via formed between two interior layers of a PCB. Accordingly, a buried via is not visible from either side of the PCB.

As described above, during transmission of signals across conductive signal traces on a PCB, crosstalk can occur. Crosstalk refers to undesired electromagnetic interference or coupling between signal traces and/or vias on the PCB. This interference can occur when signals on one trace and/or via affect or "talk" to nearby traces and/or vias, causing unintended signal distortion or noise. Crosstalk can be particularly problematic in high-speed digital circuits and analog circuits where signal integrity is critical. Crosstalk can cause various issues, including distorting signal shapes, affecting the timing of signals, and/or introducing bit errors or data corruption.

To improve signal integrity, and mitigate crosstalk on a PCB, the PCB can include ground planes that act as shields helping to block or reduce the electromagnetic fields that cause crosstalk. Some common solutions that help mitigate crosstalk with respect to signal vias include forming multiple ground vias around each of the signal vias. The multiple ground vias are electrically coupled to the ground plane and extend between multiple layers of the PCB to form a shield around at least part of the signal via. However, this arrangement of ground vias does not provide sufficient shielding for especially high transmission rates, such as for high-speed differential pair or single-end signals. For example, ground vias may not provide sufficient ground shielding of a signal via transmitting 212 Gbps per differential pair or 45 Gbps per lane single-end signals. Additionally, ground vias often extend through all layers of a PCB, limiting a power plane of the PCB and limiting the locations at which signal traces can fan out from the signal via.

Other solutions that help mitigate crosstalk include a coaxial via design where a ground shield is formed around the signal via. The ground shield is coaxial with the signal via and extends from the bottom of the signal via to the top of the signal via. Although the coaxial ground arrangement provides good shielding, a signal trace electrically coupled to the signal via cannot fan out (e.g., extend from the signal via) at just any layer of the PCB; the signal trace(s) can only couple to the signal via at the top or bottom of the signal via. Moreover, this coaxial via design is expensive to implement in a PCB.

Aspects of the present disclosure can address the deficiencies above and other challenges by implementing slot grounds on PCBs for improved signal integrity. A PCB as described herein can include a stack of layers. The stack of layers can include a first signal trace on a first layer and a second signal trace on a second layer. The signal traces can be electrically coupled by a signal via extending between the two layers. To reduce signal interference with respect to the signal via, the PCB can include a slot ground that provides ground shielding for the signal via. The slot ground can be made up of a slot formed in the PCB at least partially surrounding the signal via. In some embodiments, the slot substantially forms a C-shaped profile. The signal traces may couple to the signal via through the open portion of the C-shaped profile, allowing the signal traces to couple to the signal via at any layer of the PCB. The slot ground further includes metal plating on the walls of the slot. The metal plating may be electrically coupled to a ground plane of the PCB. In some embodiments, the ground slot includes a resin (e.g., and/or ink) at least partially filling the slot so that the ground slot does not form a void in the PCB.

In some embodiments, the slot ground at least partially surrounds a single signal via, such as for the transmission of single-lane signals. However, in some embodiments, the slot ground at least partially surrounds two signal vias, such as for the transmission of a differential pair signal. Two signals can be accommodated within the slot ground by elongating the profile of the slot (e.g., by lengthening the C-shaped profile). In some embodiments, where the slot ground at least partially surrounds a single signal via, the central axis of the slot is substantially coaxial with a central axis of the signal via. For example, the center axis of the C-shaped profile of the slot may be coaxial with the center axis of the signal via.

A slot ground may be formed in a PCB using methods described herein. In some embodiments, multiple layers (e.g., conductive and/or non-conductive) layers are laminated together to form a multi-layer structure. One or more holes may be drilled through the laminated layers to form one or more vias. In some embodiments, the holes are drilled completely through all the layers, such as to form a through-hole via. In some embodiments, the holes are drilled through only some of the layers, such as to form a blind via. The one or more vias may be signal vias for transmitting an electrical signal between signal traces that are located on different layers of the PCB. To form a slot ground, multiple holes may be drilled around a signal via through at least some of the laminated layers. The multiple holes may be drilled adjacent to one another so that a slot is formed that substantially surrounds the signal via. The slot may have a C-shaped profile. In some embodiments, the holes are drilled to a first depth using a mechanical drilling tool (e.g., such as a drill bit, etc.) and are finish-drilled to a deeper second depth using a laser drilling tool. Once the signal via and slot are formed by drilling, the interior walls may be plated with a conductive material. The slot and/or the signal via hole may be filled with a resin (e.g., an ink resin, etc.) to eliminate voids in the signal via hole and/or in the slot.

Advantages of the present disclosure include, for example, improved signal integrity by reducing crosstalk between signal traces and/or signal vias within close proximity. A slot ground provides improved ground shielding of a signal via for high rates of data transfer (e.g., such as for 212 Gbps per differential pair or 45 Gbps per lane single-end signals) when compared to current solutions. Additionally, the slot ground described herein allow for signal traces to connect to a signal via at any layer of the PCB, which is an improvement in versatility compared to other techniques currently used. Moreover, the slot ground described herein can be made with a reduced cost compared to conventional solutions.

Figure 1B:
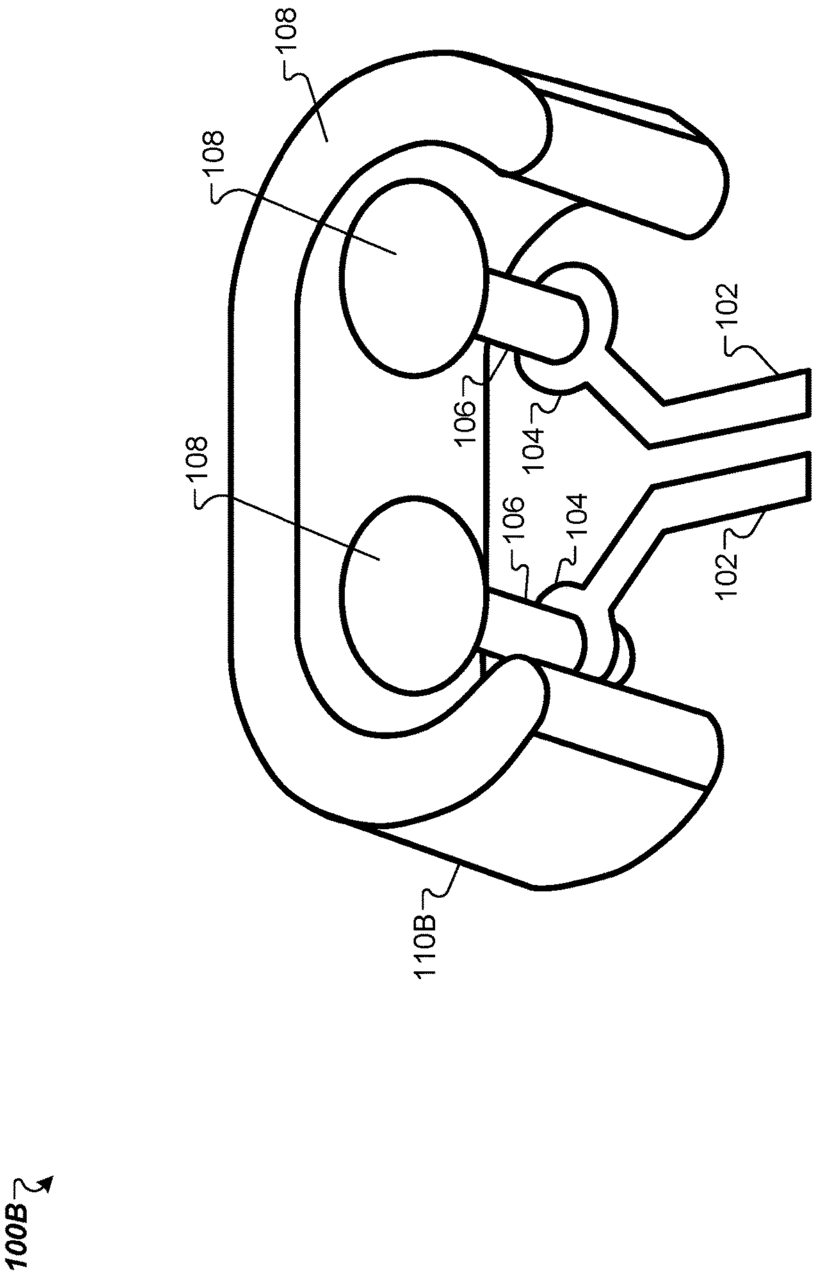

FIGS. 1A-1B are perspective views of example slot grounds, in accordance with at least some embodiments. Referring to FIG. 1A, a perspective view of an example arrangement 100A of a slot ground 110A is shown. Arrangement 100A may be used for the transmission of a single-end signal. In some embodiments, a slot ground 110A at least partially surrounds a signal via 106. In some embodiments, the slot ground 110A has a C-shaped profile. A signal trace 102 can connect to the signal via 106 through the open portion of the C-shaped profile. Because the open portion of the C-shaped profile extends through the entire height of the slot ground 110A, the signal trace 102 can electrically couple to the signal via 106 at any layer of the PCB without being blocked by the slot ground 110A. The slot ground 110A and the signal via 106 may be substantially co-axial, meaning the center axis of the signal via 106 is substantially co-axial with the center of the slot ground 110A. The signal trace 102 may electrically connect to the signal via 106 by a signal pad 104. In some embodiments, the signal via 106 intersects multiple signal pads 104. The signal pads 104 intersected by the signal via 106 but not coupled to a signal trace 102 may be referred to as non-functional pads. The signal via 106 may electrically couple the signal pads 104 to the trace 102. Another signal trace (not shown) may be coupled to another one of the signal pads 104. In some embodiments, the walls of the slot ground 110A are between approximately 0.10 mm and 0.15 mm from the edges of signal pad 104. In some embodiments, the walls of the slot ground 110A are between approximately 0.10 mm and 0.15 mm from the edges of the signal trace 102.

In some embodiments, the inner walls of the slot ground 110A are plated with a metal plating. The inner walls of the signal via 106 may be plated with the same metal plating and may be plated during the same plating operation. The metal plating can include a metal such as copper, tin, lead, gold, nickel, silver, or one or more metal alloys, etc. In some embodiments, the metal plating of slot ground 110A is electrically coupled to a ground plane of a PCB. By electrically coupling the metal plating of slot ground 110A with a ground plane, the slot ground 110A can reduce signal interference with respect to the signal via 106. For example, the slot ground 110A may protect the signal via 106 from crosstalk emitted from other signal vias in close proximity on the PCB. In some embodiments, the signal via 106 and/or the slot ground 110A are at least partially filled with resin 108. The signal via 106 and/or the slot ground 110A are filled with resin to minimize and/or eliminate voids in the PCB. The resin may include an epoxy resin or a polyimide resin. In some embodiments, the signal via 106 has a nominal impedance of between approximately 60 ohms and approximately 100 ohms. In some embodiments, the signal via 106 has a nominal impedance of approximately 85 ohms.

Referring to FIG. 1B, a perspective via of an example arrangement 100B of a slot ground 110B is shown. Arrangement 100B may be used for the transmission of a differential pair signal. In some embodiments, slot ground 110B at least partially surrounds a first signal via 106 and a second signal via 106. A first signal trace 102 and a second signal trace 102 may electrically couple to the signal vias 106. The two signal vias 106 may be within the C-shaped profile of slot ground 110B. The traces 102 may couple to the signal vias 106 through the open portion of the C-shaped profile.

Figure 2A:
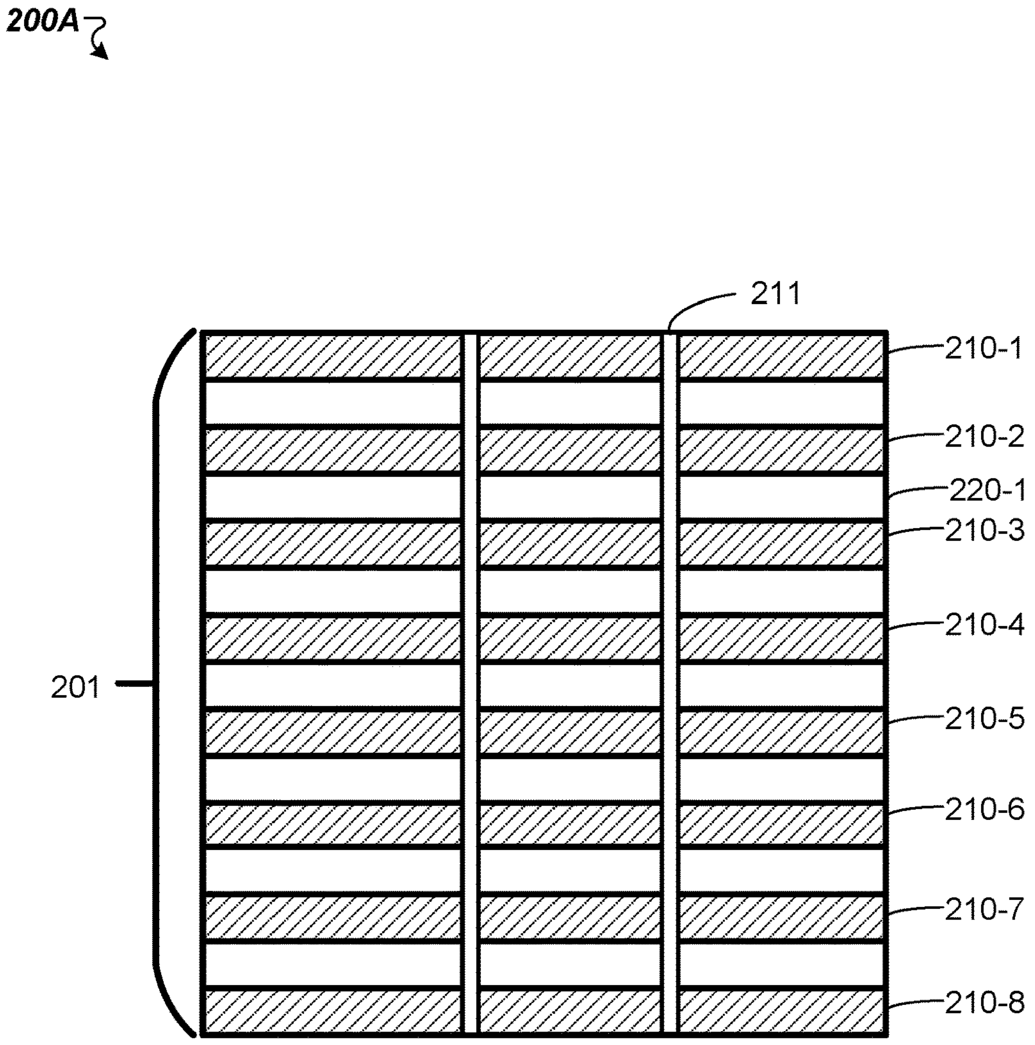
FIGS. 2A-2F are diagrams illustrating the fabrication of an example electronic device including a printed circuit board (PCB) having a slot ground, in accordance with at least some embodiments.

FIGS. 2A-2F are diagrams illustrating the fabrication of an example electronic device including a printed circuit board (PCB) having a slot ground, in accordance with at least some embodiments. FIG. 2A shows operation 200A for obtaining set of layers 201. Set of layers 201 can include alternating conductive layers and non-conductive layers. More specifically, each non-conductive layer may be disposed between a respective pair of conductive layers. For example, as shown, set of layers 201 can include conductive layers 210-1 through 210-8 and non-conductive layers including non-conductive layer 220-1. In some embodiments, set of layers 201 corresponds to a set of core layers of the PCB. Accordingly, in this illustrative example, set of layers 201 includes 8 conductive layers. Each of the conductive layers 210-1-210-8 may be at least partially separated by an insulating channel 211. An insulating channel 211 may be formed in a region where a signal via is to be later formed. In some embodiments, insulating channel 211 may include breaks in the conductive layers 210-1-210-8. For example, insulating channel 211 may be formed by a lack of conductive material at certain corresponding regions of the conductive layers 210-1-210-8.

Each conductive layer 210-1 through 210-8 can include any suitable electrically conductive material (e.g., metal). Examples of materials that can be used to form each conductive layer 210-1 through 210-8 include copper (Cu), tungsten (W), cobalt (Co), molybdenum (Mo), ruthenium (Ru), etc. Non-conductive layers including non-conductive layer 220-1 may be formed from a non-conductive (e.g., electrically insulating) material. Examples of non-conductive materials that may be used for the non-conductive layers including non-conductive layer 220-1 include a composite plasticized phenol resin and paper material (e.g., FR-2), a composite material of woven fiberglass (e.g., FR-4), plastics, flexible plastics (e.g., for flexible circuit boards), and so on.

Figure 2B:
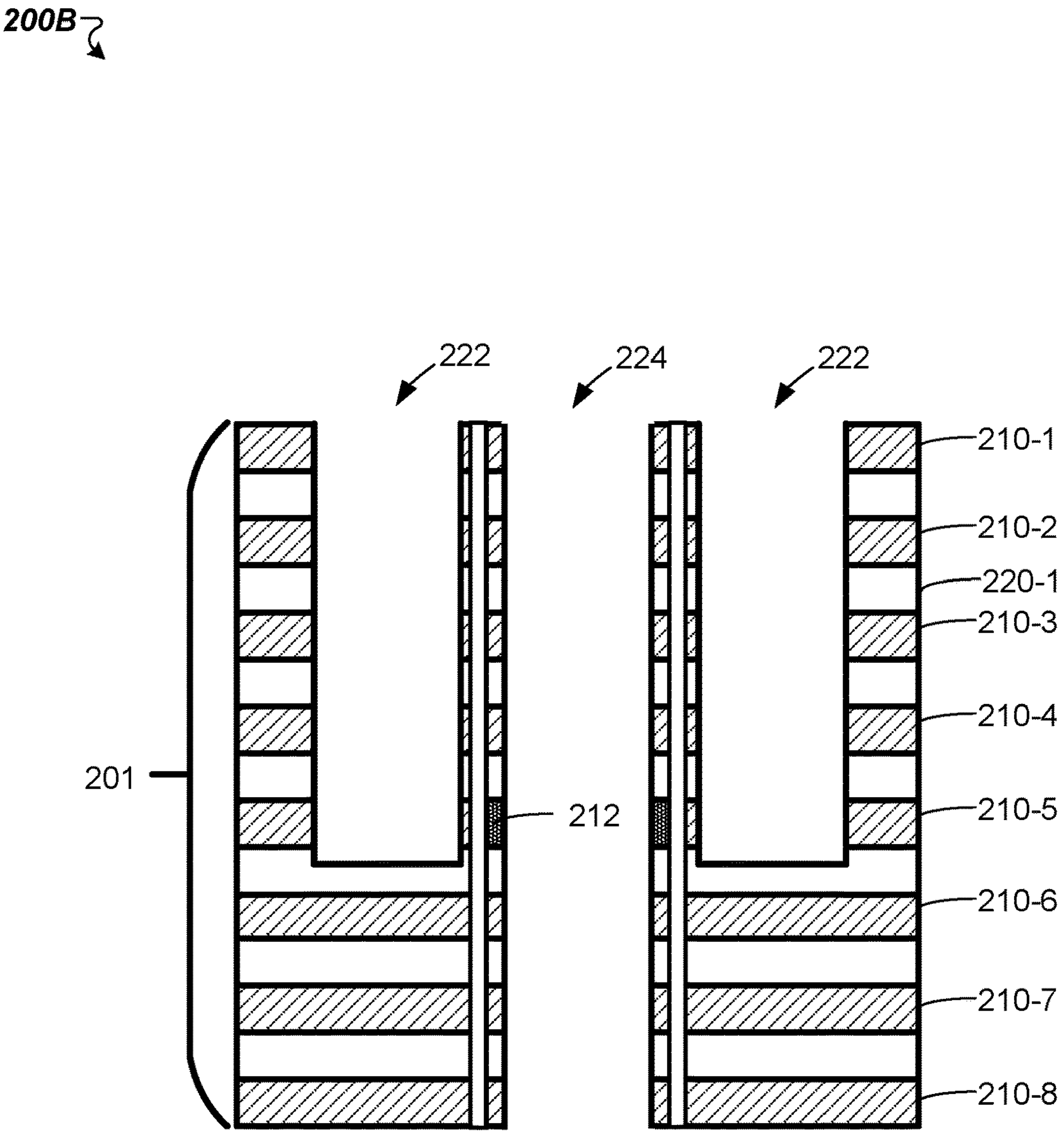

FIG. 2B shows operation 200B for drilling a through-hole 224 (e.g., for a through-hole via) and a slot 222 (e.g., for a slot ground). In some embodiments, a mechanical drilling tool (e.g., a drill bit, etc.) is used to drill the through-hole 224 through all of the set of layers 201. A mechanical drilling tool may also be used to drill multiple adjacent holes to form the slot 222. The slot 222 may be formed by drilling a first hole, a second hole immediately adjacent to the first hole, a third hole immediately adjacent to the third hole, etc. to make a C-shaped profile slot that at least partially surrounds the through-hole 224. In some embodiments, the through-hole 224 is drilled through a conductive pad 212 (e.g., a signal pad) disposed on a conductive layer (such as conductive layer 210-5). In some embodiments, the holes forming the slot 222 are drilled using the mechanical drilling tool to a first depth. For example, the holes forming the slot 222 are drilled to a depth between layer 210-5 and layer 210-6. The holes may be finish-drilled using a laser drilling tool as explained herein below with respect to FIG. 2C.

Figure 2C:
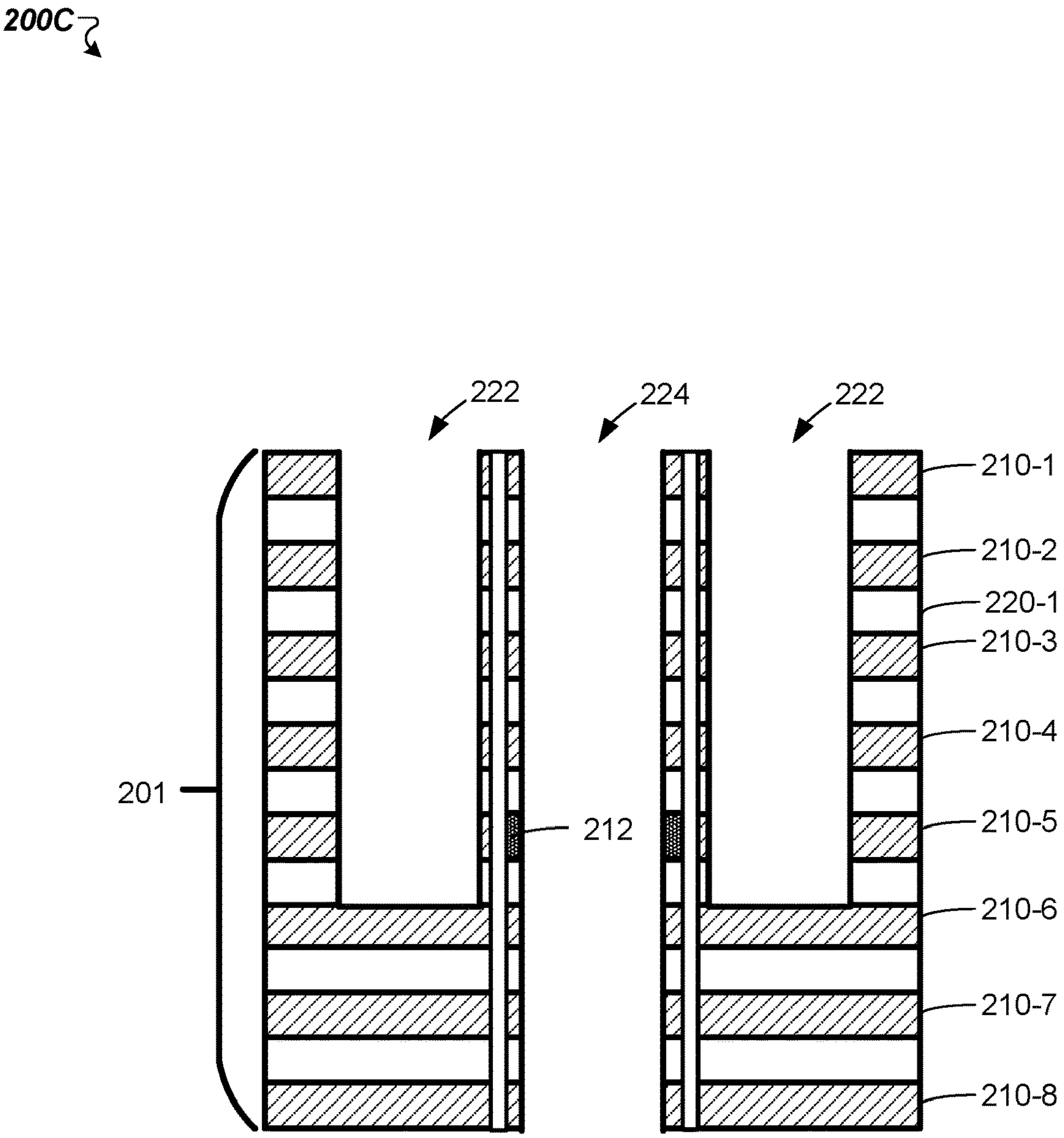

FIG. 2C shows operation 200C for finish-drilling the holes that make up the slot 222. In some embodiments, a laser drilling tool (e.g., a laser driller, etc.) is used to increase the depth of the slot 222. Because laser drilling tools have better tolerance control than mechanical drilling tools, a laser drilling tool can more precisely drill the holes forming the slot 222. In some embodiments, a laser drilling tool is used to increase the depth of the slot 222 to layer 210-6. The depth of the slot 222 may extend beneath the level of the conductive pad 212. For example, the conductive pad 212 is disposed on a first intermediate layer (e.g., layer 210-5) of the PCB. The slot 222 may extend from a top layer of the PCB (e.g., layer 210-1) to a second intermediate layer (e.g., layer 210-6) that is beneath the first intermediate layer associated with the conductive pad.

Figure 2D:
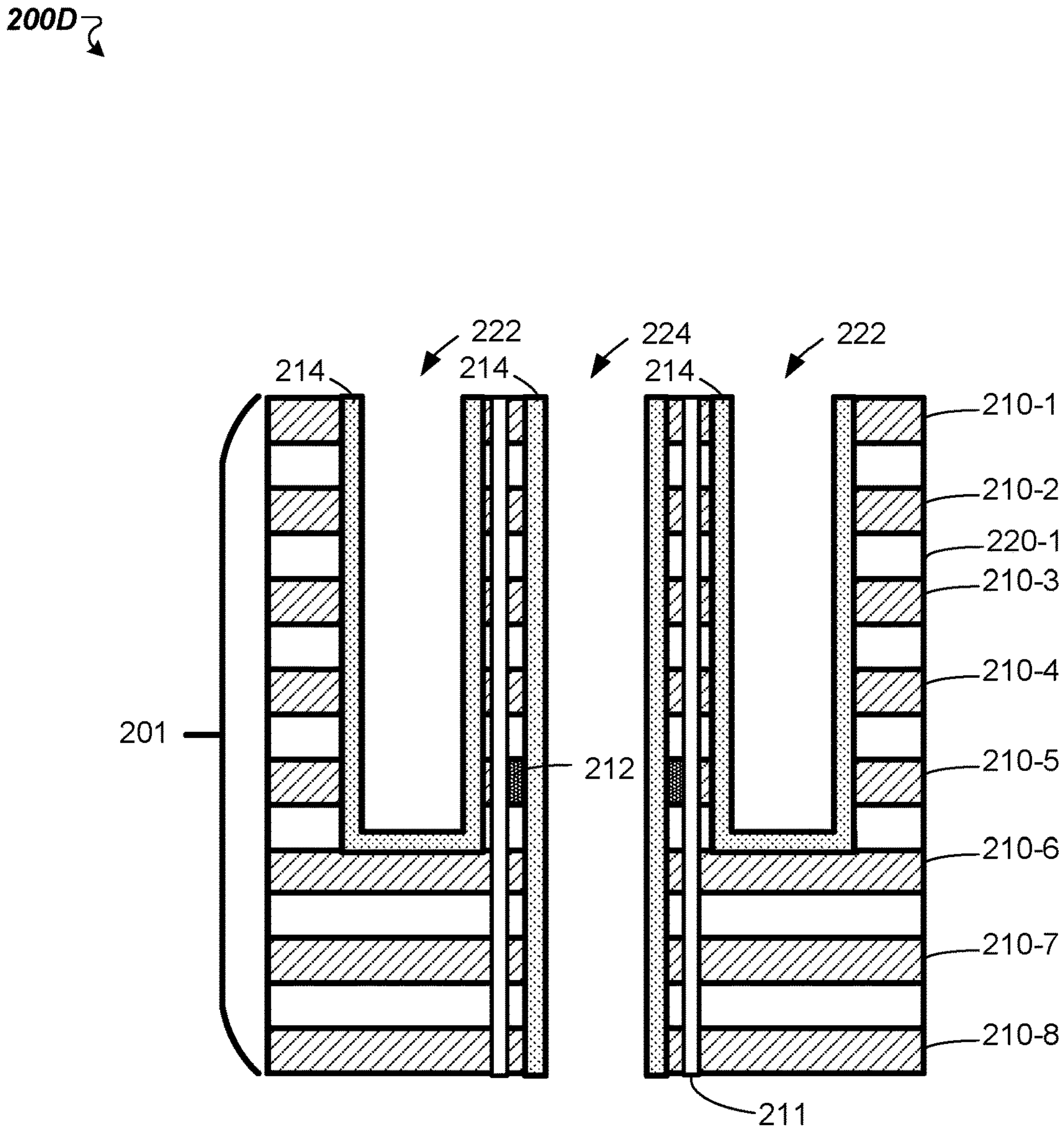

FIG. 2D shows operation 200D for plating the through-hole 224 and slot 222 with a metal plating 214. In some embodiments, the walls of the through-hole 224 and/or the walls of the slot 222 are plated with metal plating 214. The metal plating 214 on the walls of the slot 222 may be electrically coupled to a ground layer of the PCB. The metal plating 214 on the walls of the through-hole 224 may be electrically coupled to the conductive pad 212. The metal plating 214 on the walls of the through-hole 224 may be electrically insulated from the metal plating 214 on the walls of the slot 222 by insulating channel 211.

Figure 2E:
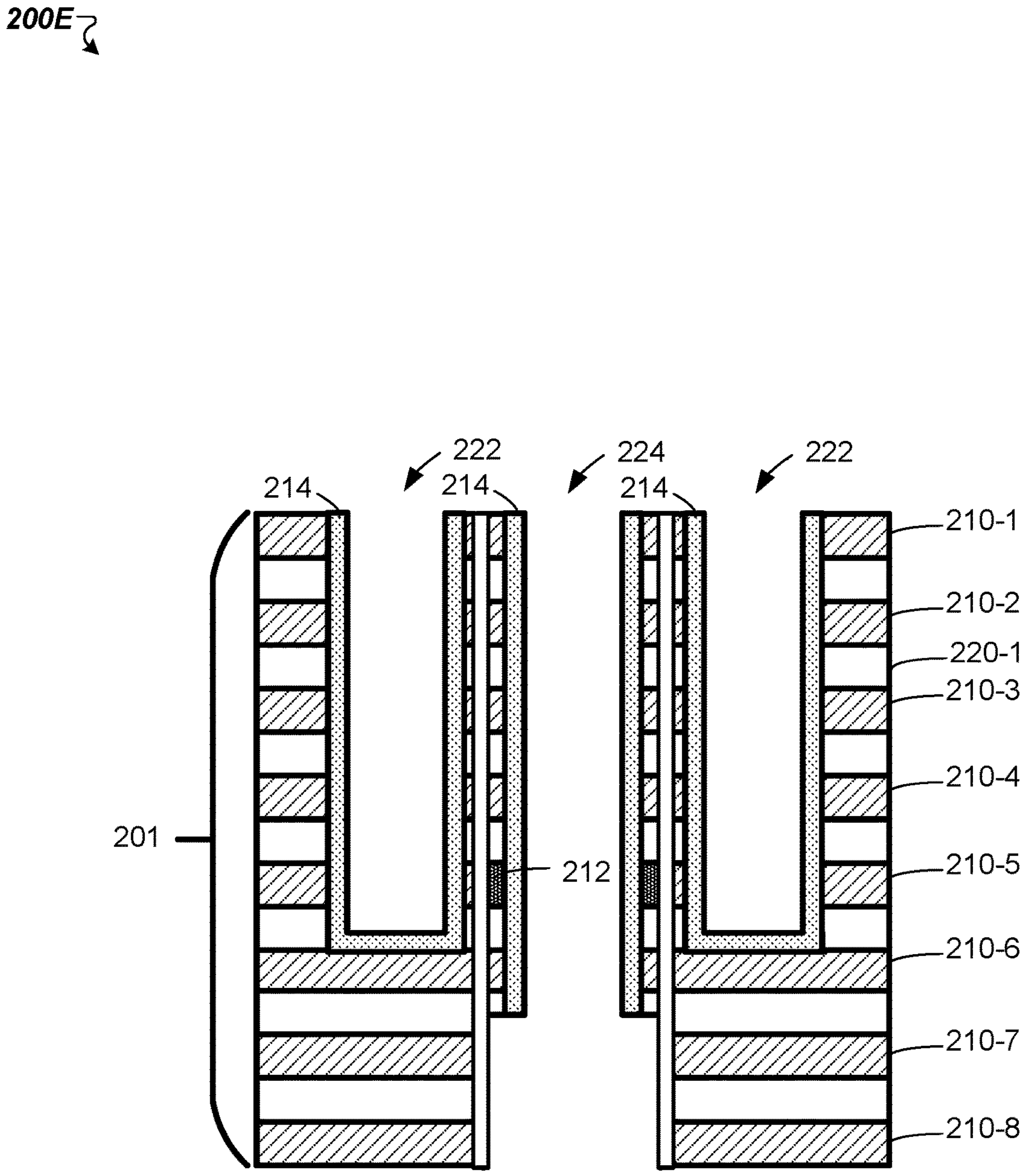

FIG. 2E shows operation 200E for back-drilling the through-hole 224. In some embodiments, the bottom of through-hole 224 is back-drilled (e.g., using a mechanical drilling tool) to remove the plating 214 from at least a portion of the through-hole 224 that is below the conductive pad 212. Back-drilling may refer to increasing the diameter of the bottom portion of the through-hole 224 (e.g., to remove the plating 214). Removing at least some of the plating 214 from the lower portion of the through-hole 224 that is beneath the conductive pad 212 may reduce the stub length of the signal via comprising the through-hole 224 which can improve the integrity of electrical signals transmitted through the signal via. In some embodiments, the through-hole 224 is back-drilled through at least one layer of the PCB. For example, through-hole 224 is back-drilled through conductive layer 210-8 and conductive layer 210-7. The upper portion of the through-hole 224 retains the metal plating. The upper portion of the through-hole may correspond to the portion above an intermediate layer of the PCB (e.g., layer 210-5) having the conductive pad 212. After back-drilling, the lower portion of the through-hole 224 lacks the metal plating.

Figure 2F:
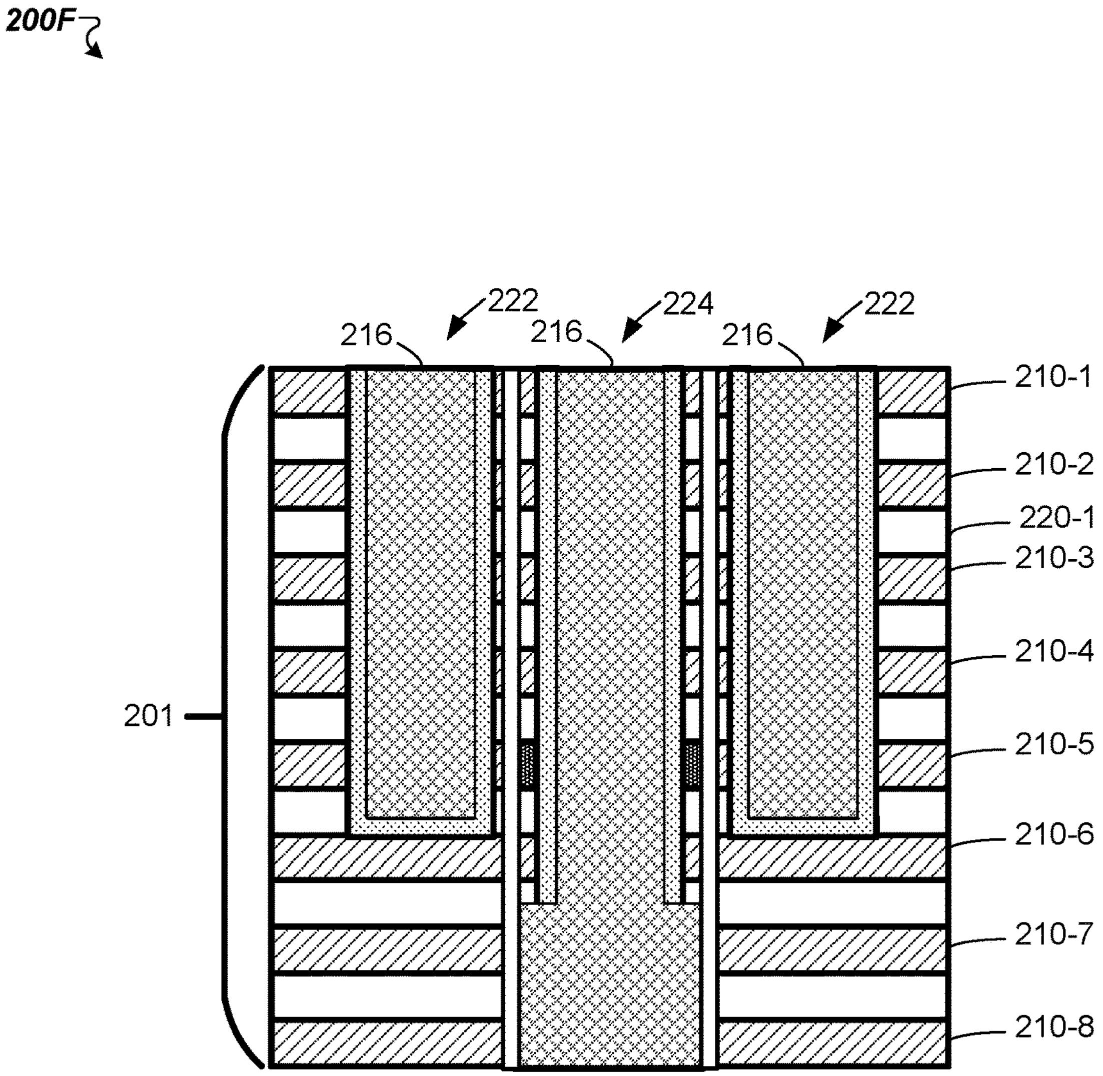

FIG. 2F shows operation 200F for filling the through-hole 224 and the slot 222 with a resin 216. In some embodiments, the through-hole 224 and/or the slot 222 are at least partially filled with a resin to minimize and/or eliminate voids within the PCB. The resin may include an epoxy resin or a polyimide resin. The resin may include an ink-based resin, etc. In some embodiments, a signal trace disposed on conductive layer 210-5 is electrically coupled to the metal plating 214 on the walls of through-hole 224 via conductive pad 212. An electrical signal may be transmitted through the metal plating to another conductive pad disposed on another conductive layer. A slot ground (e.g., made up of slot 222 and associated metal plating, etc.) may reduce electrical interference such as crosstalk with respect to the electrical signal traveling between electrical components on the PCB.

Figure 3A:
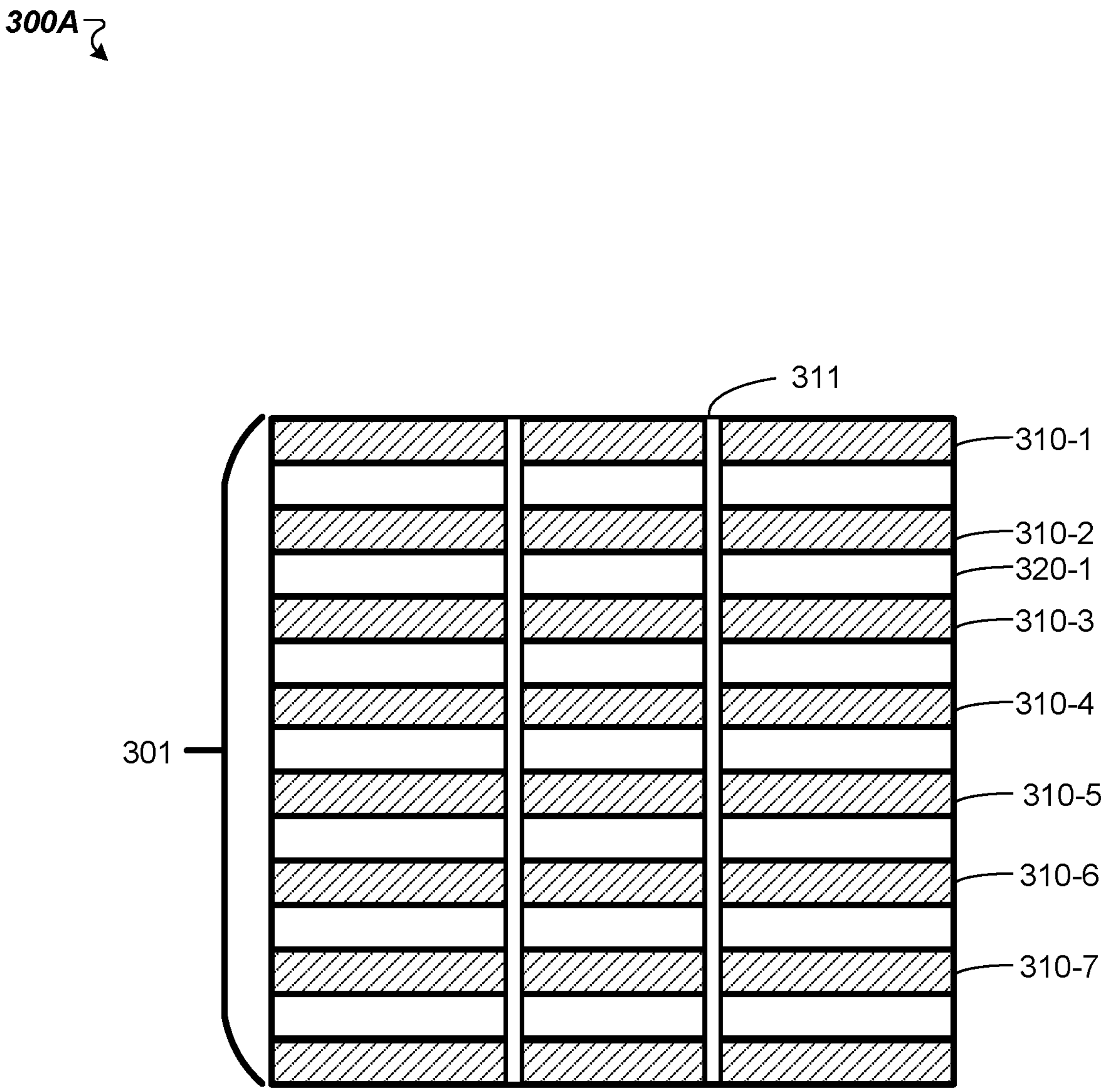
FIGS. 3A-3E are diagrams illustrating the fabrication of an example electronic device including a PCB having a slot ground, in accordance with at least some embodiments.

FIGS. 3A-3E are diagrams illustrating the fabrication of an example electronic device including a PCB having a slot ground, in accordance with at least some embodiments. FIG. 3A shows operation 300A for obtaining set of layers 301. Set of layers 301 can include alternating conductive layers and non-conductive layers. More specifically, each non-conductive layer may be disposed between a respective pair of conductive layers. For example, as shown, set of layers 301 can include conductive layers 310-1 through 310-8 and non-conductive layers including non-conductive layer 320-1. In some embodiments, set of layers 301 corresponds to a set of core layers of the PCB. Accordingly, in this illustrative example, set of layers 301 includes 8 conductive layers. Each of the conductive layers 310-1-310-8 may be at least partially separated by an insulating channel 311. An insulating channel 311 may be formed in a region where a signal via is to be later formed. In some embodiments, insulating channel 311 may include breaks in the conductive layers 310-1-310-8. For example, insulating channel 311 may be formed by a lack of conductive material at certain corresponding regions of the conductive layers 310-1-310-8.

Each conductive layer 310-1 through 310-8 can include any suitable electrically conductive material (e.g., metal). Examples of materials that can be used to form each conductive layer 310-1 through 310-8 include copper (Cu), tungsten (W), cobalt (Co), molybdenum (Mo), ruthenium (Ru), etc. Non-conductive layers including non-conductive layer 320-1 may be formed from a non-conductive (e.g., electrically insulating) material. Examples of non-conductive materials that may be used for the non-conductive layers including non-conductive layer 320-1 include a composite plasticized phenol resin and paper material (e.g., FR-2), a composite material of woven fiberglass (e.g., FR-4), plastics, flexible plastics (e.g., for flexible circuit boards), and so on.

Figure 3B:
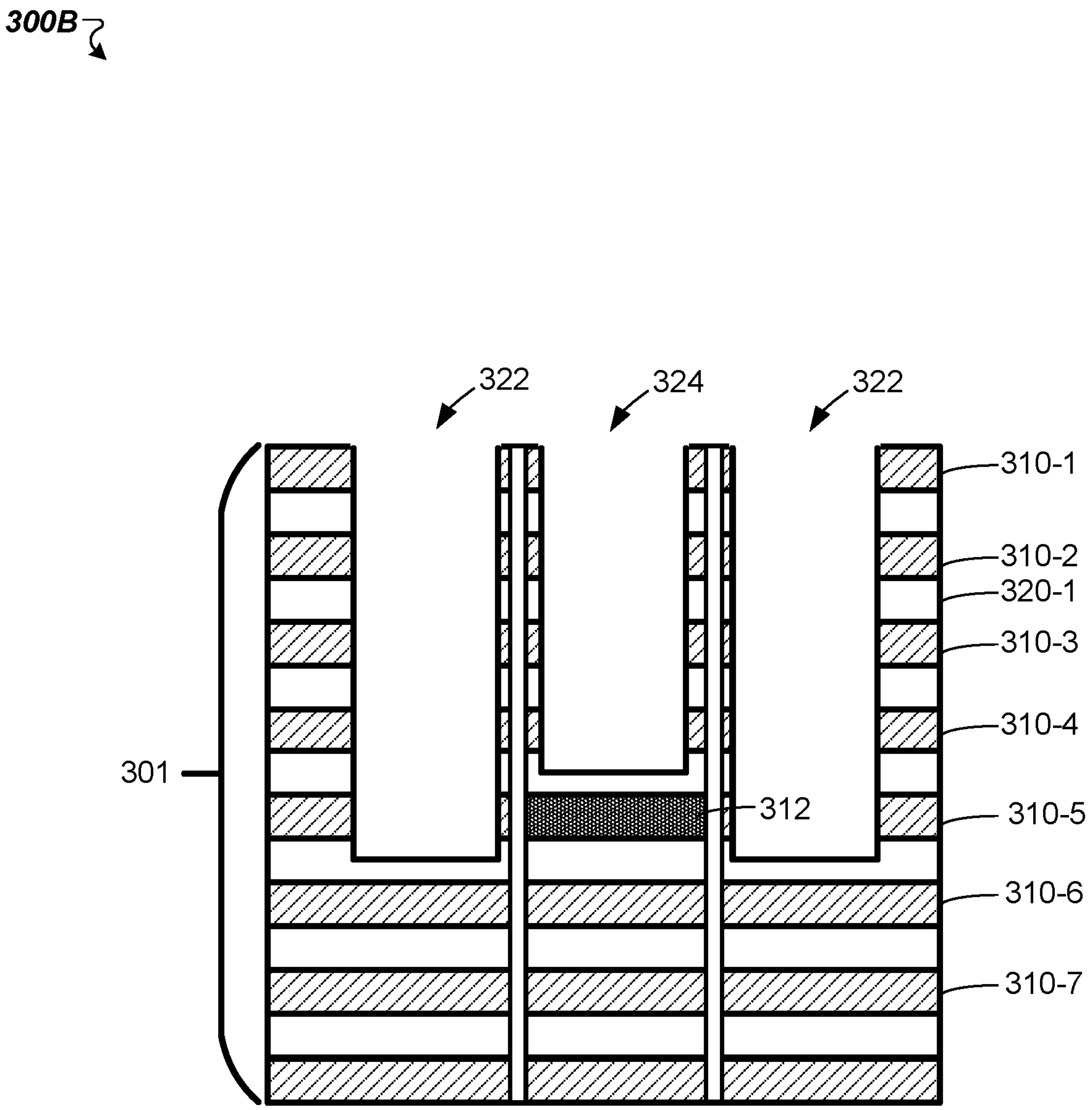

FIG. 3B shows operation 300B for drilling a blind hole 324 (e.g., for a blind via) and a slot 322 (e.g., for a slot ground). In some embodiments, a mechanical drilling tool (e.g., a drill bit, etc.) is used to drill the blind hole 324 through at least one of the set of layers 301. For example, the blind hole 324 may be mechanically drilled through conductive layers 310-1, 310-2, 310-3, and 310-4. In some embodiments, the blind hole 324 is drilled using the mechanical drilling tool to a first depth. The blind hole 324 may be finish-drilled using a laser drilling tool as herein explained below with respect to FIG. 3C.

A mechanical drilling tool may also be used to drill multiple adjacent holes to form the slot 322. The slot 322 may be formed by drilling a first hole, a second hole immediately adjacent to the first hole, a third hole immediately adjacent to the third hole, etc. to make a C-shaped profile slot that at least partially surrounds the blind hole 324. In some embodiments, the blind hole 324 is drilled through a conductive pad 312 (e.g., a signal pad) disposed on a conductive layer (such as conductive layer 310-5). In some embodiments, the holes forming the slot 322 are drilled using the mechanical drilling tool to a first depth. For example, the holes forming the slot 322 are drilled to a depth between layer 310-5 and layer 310-6. The holes may be finish-drilled using a laser drilling tool as explained herein below with respect to FIG. 3C.

Figure 3C:
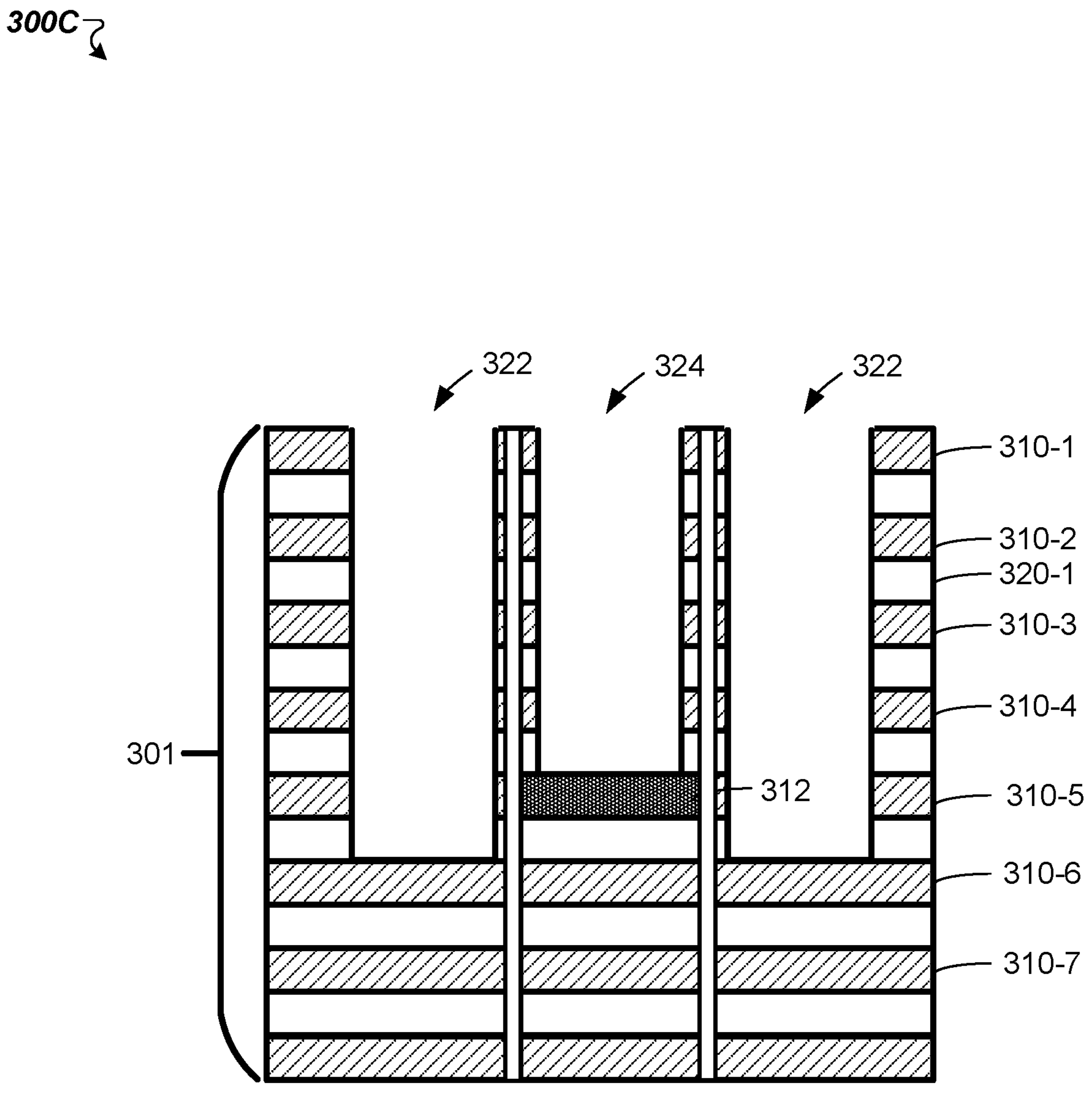

FIG. 3C shows operation 300C for finish-drilling the blind hole 324 and the holes that make up the slot 322. In some embodiments, the depth of the blind hole 324 is increased using a laser drilling tool (e.g., a laser driller, etc.). The depth of the blind hole 324 may be increased to layer 310-5, corresponding to the location of a conductive pad 312. In some embodiments, the laser drilling tool is used to increase the depth of the slot 322. In some embodiments, a laser drilling tool is used to increase the depth of the slot 322 to layer 310-6. The depth of the slot 322 may extend beneath the level of the conductive pad 312. Because laser drilling tools have better tolerance control than mechanical drilling tools, a laser drilling tool can more precisely drill the blind hole 324 and/or the holes forming the slot 322.

Figure 3D:
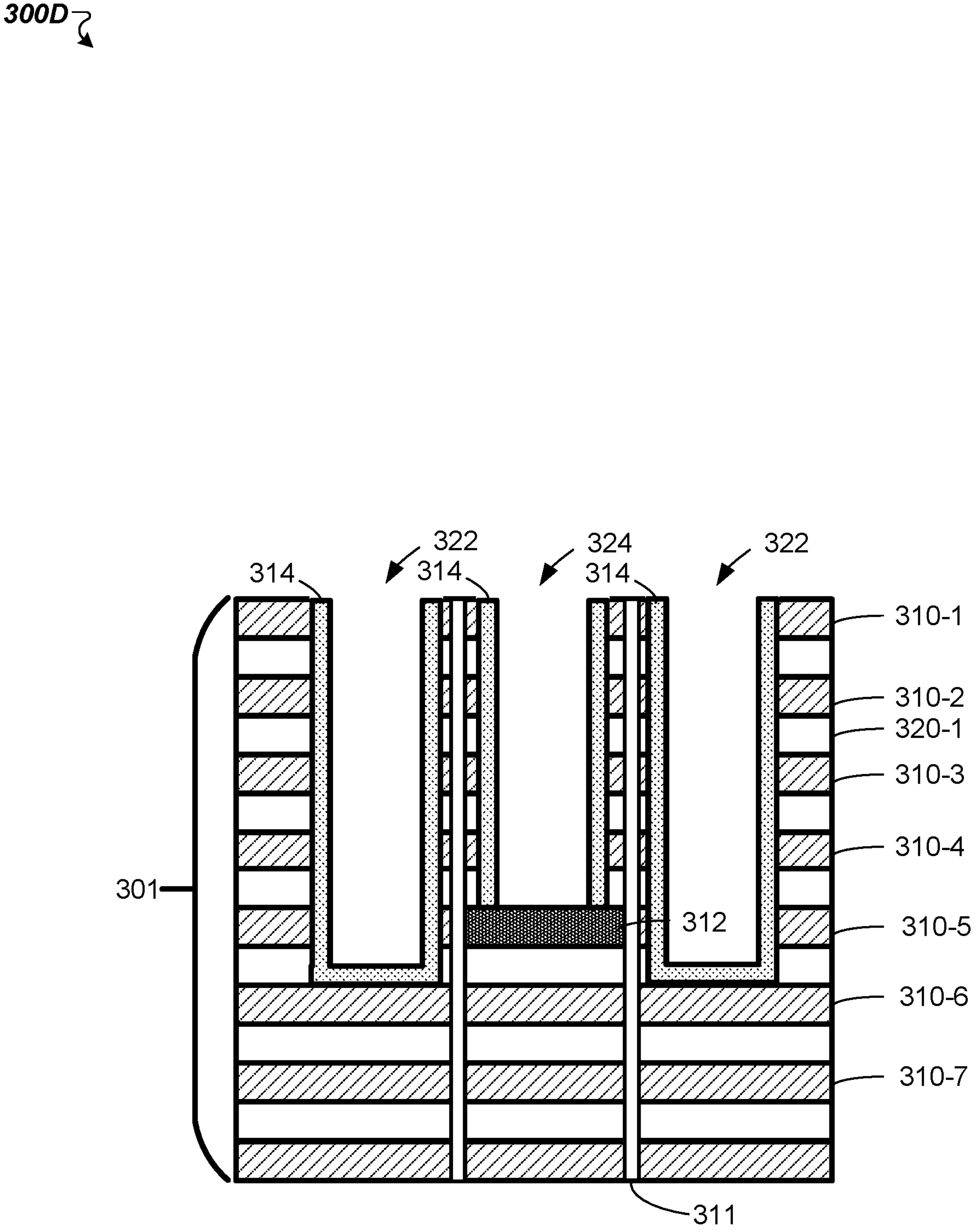

FIG. 3D shows operation 300D for plating the blind hole 324 and slot 322 with a metal plating 314. In some embodiments, the walls of the blind hole 324 and/or the walls of the slot 322 are plated with metal plating 314. The metal plating 314 on the walls of the slot 322 may be electrically coupled to a ground layer of the PCB. The metal plating 314 on the walls of the blind hole 324 may be electrically coupled to the conductive pad 312. The metal plating 314 on the walls of the through-hole 324 may be electrically insulated from the metal plating 314 on the walls of the slot 322 by insulating channel 311.

Figure 3E:
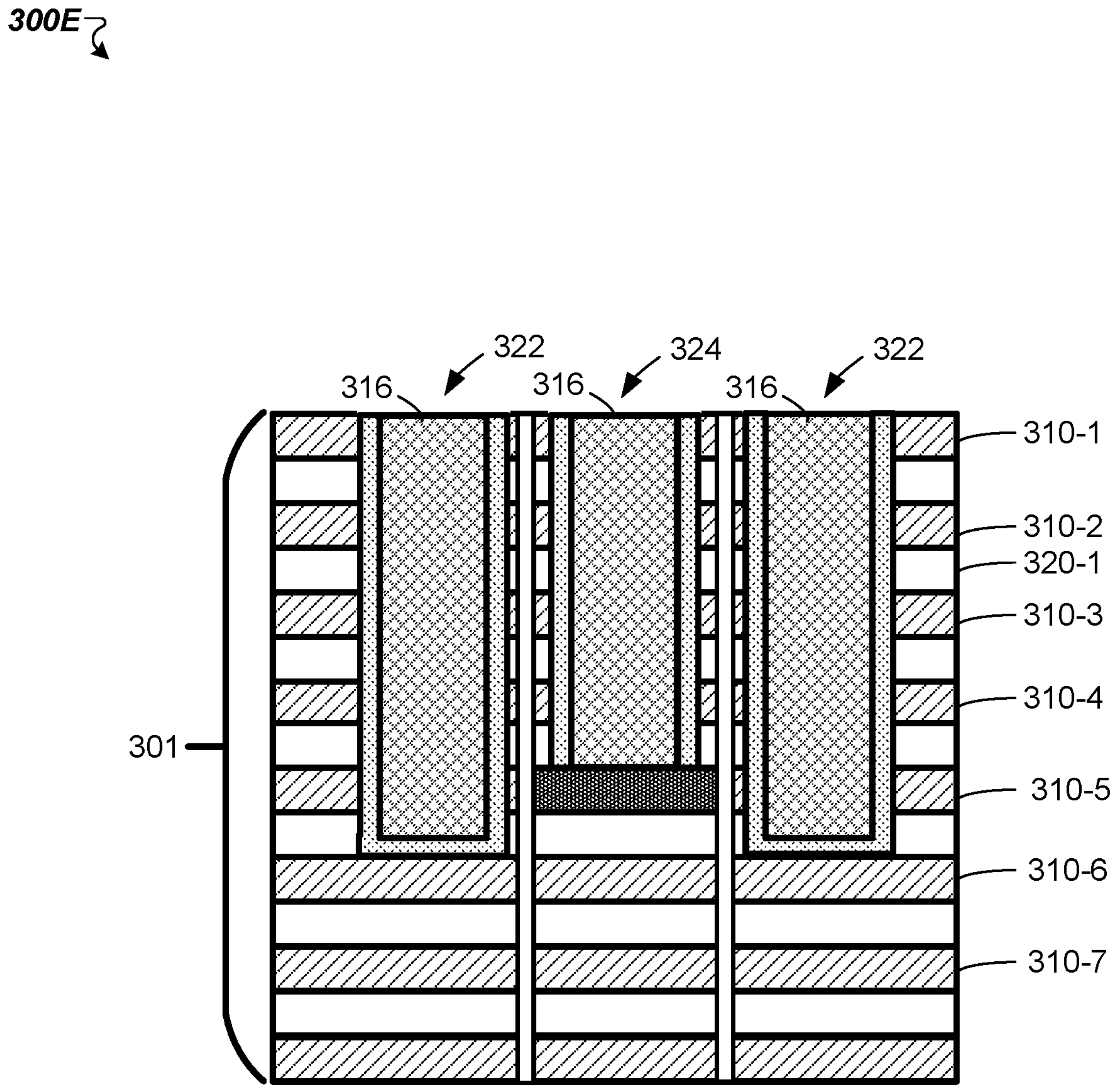

FIG. 3E shows operation 300E for filling the blind hole 324 and the slot 322 with a resin 316. In some embodiments, the blind hole 324 and/or the slot 322 are at least partially filled with a resin to minimize and/or eliminate voids within the PCB. The resin may include an epoxy resin or a polyimide resin. The resin may include an ink-based resin, etc. In some embodiments, a signal trace disposed on conductive layer 310-5 is electrically coupled to the metal plating 314 on the walls of blind hole 324 via conductive pad 312. An electrical signal may be transmitted through the metal plating to another conductive pad disposed on another conductive layer. A slot ground (e.g., made up of slot 322 and associated metal plating, etc.) may reduce electrical interference such as crosstalk with respect to the electrical signal.

Figure 4:
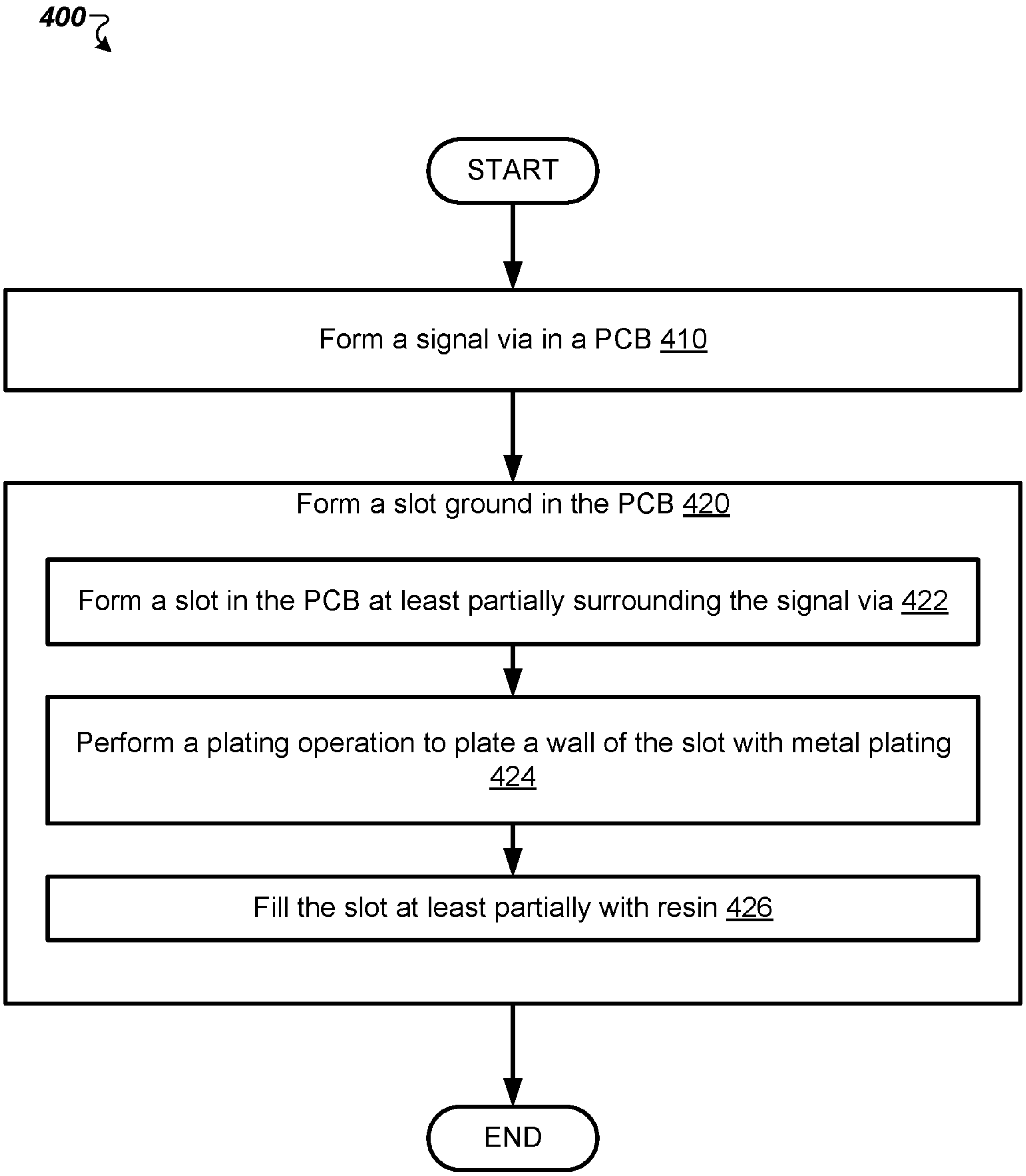
FIG. 4 is a flow diagram of an example method of fabricating an electronic device including a PCB having a slot ground, in accordance with at least some embodiments.

FIG. 4 is a flow diagram of an example method 400 of fabricating an electronic device including a PCB having a slot ground, in accordance with at least some embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a signal via is formed in a PCB. The signal via may be a blind via or a through-hole via as described herein above. The via may be formed by drilling through one or more layers in the PCB and plating the walls of the hole to electrically connect conductive signal pads on different layers of the PCB. In some embodiments, another signal via (e.g., a second signal via) is formed, such as in embodiments where the signal vias are to transmit a differential pair signal.

At operation 420, a slot ground is formed in the PCB. To form the slot ground, one or more sub-operations are performed. At operation 422, a slot is formed in the PCB. The slot may be formed at least partially surrounding the signal via. In some embodiments, the slot has a substantially C-shaped profile. The center of the slot (e.g., the center of the C-shaped profile) may be substantially coaxial with the central axis of the signal via. At operation 424, a plating operation is performed to plate at least a wall of the slot with metal plating. The plating operation may be performed with respect to both the slot and the signal via to plate the slot and the signal via with metal plating. The metal plating may be a conductive metal plating (e.g., copper, tin, lead, gold, nickel, silver, or one or more metal alloys, etc.). At operation 426, the slot is at least partially filled with resin. The resin may include an epoxy resin or a polyimide resin. Filling the slot with resin may reduce voids in the PCB.

Figure 5A:
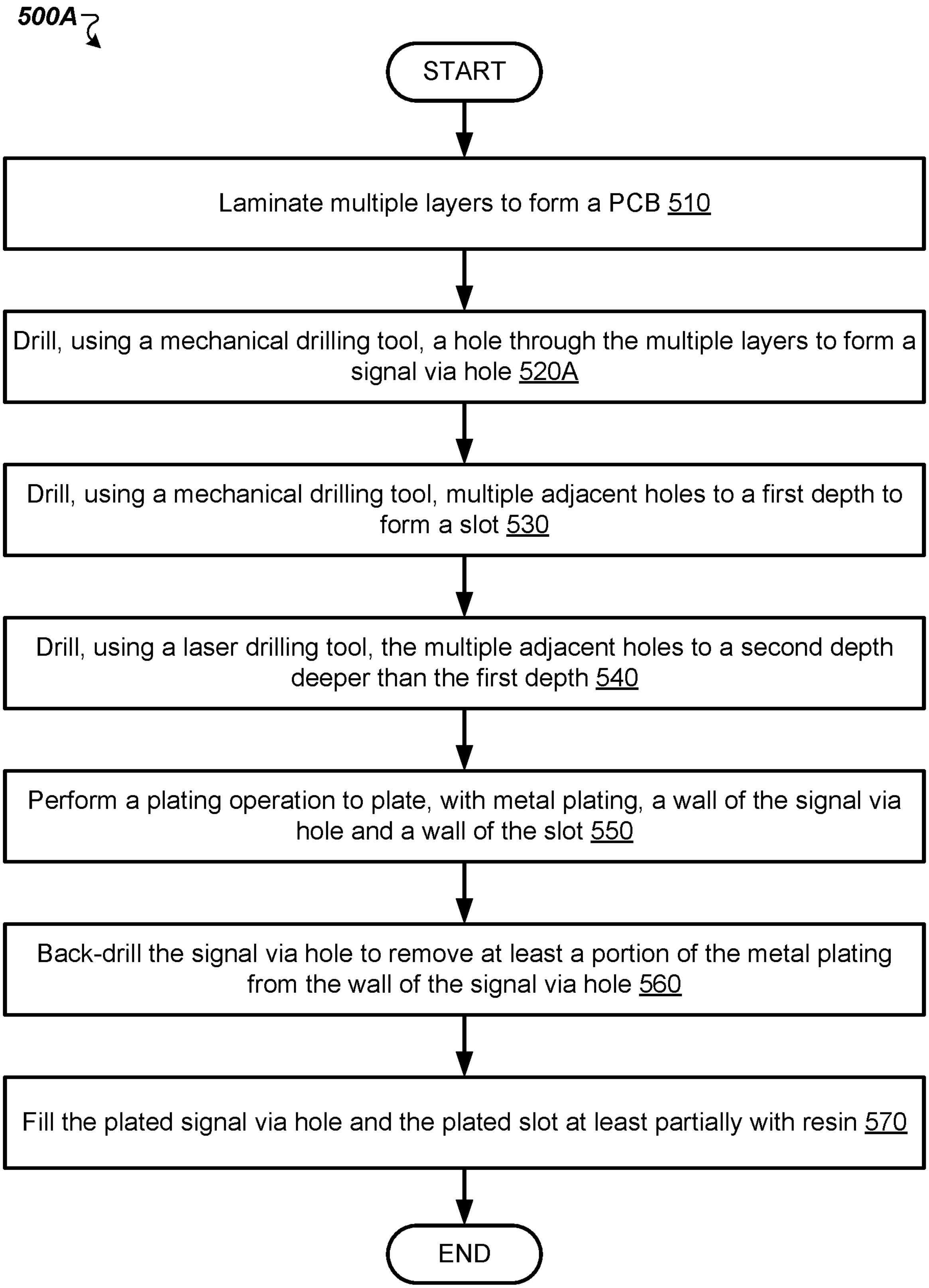
FIGS. 5A-5B are flow diagrams of example methods of fabricating an example electronic device including a PCB having a slot ground, in accordance with at least some embodiments.
Figure 5B:
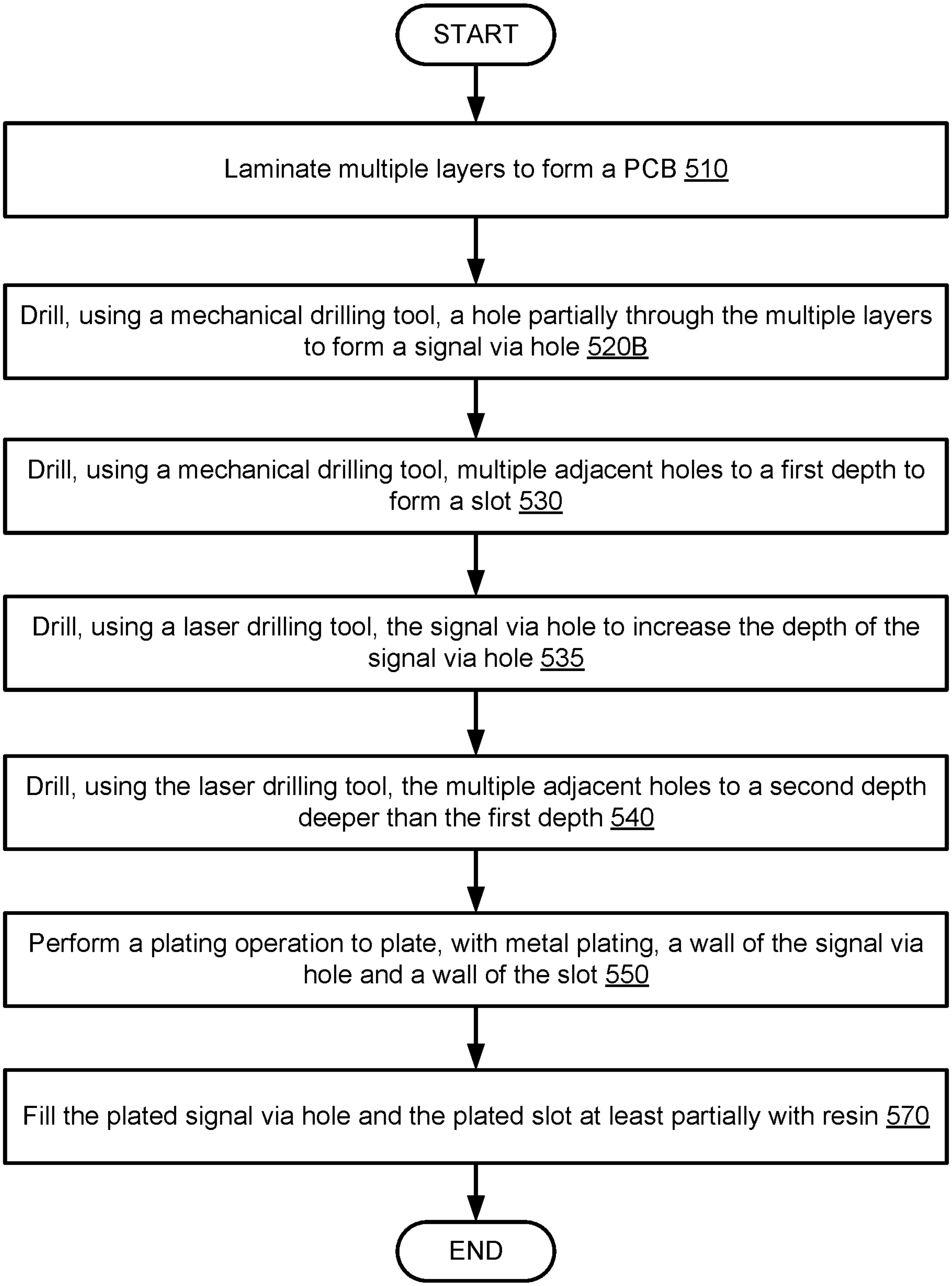

FIGS. 5A-5B are flow diagrams of example methods of fabricating an example electronic device including a PCB having a slot ground, in accordance with at least some embodiments.

Referring to FIG. 5A, is a flow diagram of an example method 500A for fabricating an example electronic device including a PCB having a slot ground at least partially surrounding a through-hole via, in accordance with at least some embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, multiple layers are laminated to form a PCB. The multiple layers may include alternating conductive and non-conductive layers. The conductive layers may include traces to transmit electrical signals. The non-conductive layers may insulate the conductive layers from one another.

At operation 520A, a hole is drilled through the multiple layers to form a signal via hole. The signal via hole may be a through-hole that extends through all layers of the PCB. In some embodiments, the hole is drilled using a mechanical drilling tool.

At operation 530, multiple adjacent holes are drilled to form a slot. The slot may at least partially surround the hole drilled at operation 520A. The holes may be drilled adjacent to one another to remove material from around the signal via. In some embodiments, the slot has a C-shaped profile. Using the mechanical drilling tool, the multiple adjacent holes may be drilled to a first depth.

At operation 540, the multiple adjacent holes are drilled to a second depth deeper than the first depth (e.g., the first depth drilled at operation 530). The multiple adjacent holes may be drilled to the second depth using a laser drilling tool. The laser drilling tool may have better tolerance control than the mechanical drilling tool so the final depth of the slot (e.g., the second depth) can be more precisely controlled.

At operation 550, a plating operation is performed to plate a wall of the signal via hole and a wall of the slot with metal plating. In some embodiments, both the walls of the signal via hole and the walls of the slot are plated during the same plating operation. In other embodiments, the walls of the signal via hole are plated separately from the walls of the slot. The metal plating can include a conductive metal plating as described herein above.

At operation 560, the signal via hole is back-drilled to remove at least a portion of the metal plating from the walls of the signal via hole. Back-drilling may include increasing the diameter of the signal via hole to remove the plating. In some embodiments, plating is removed from the signal via hole beneath a conductive pad to reduce the stub length of the signal via. Back-drilling the signal via hole may be performed prior to filling the hole with resin at operation 570.

At operation 570, the plated signal via hole and the plated slot are at least partially filled with resin. The resin may be an epoxy resin, a polyimide resin, and/or an ink resin as described herein above. Filling the plated signal via hole and the plated slot with resin may reduce the number of voids in the PCB.

Referring to FIG. 5B, is a flow diagram of an example method 500B for fabricating an example electronic device including a PCB having a slot ground at least partially surrounding a blind via, in accordance with at least some embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, multiple layers are laminated to form a PCB. The multiple layers may include alternating conductive and non-conductive layers. The conductive layers may include traces to transmit electrical signals. The non-conductive layers may insulate the conductive layers from one another.

At operation 520B, a hole is drilled partially through the multiple layers to form a signal via hole. The signal via hole may be a blind-hole that extends only partially through the PCB. In some embodiments, the hole is drilled using a mechanical drilling tool.

At operation 530, multiple adjacent holes are drilled to form a slot. The slot may at least partially surround the hole drilled at operation 520A. The holes may be drilled adjacent to one another to remove material from around the signal via. In some embodiments, the slot has a C-shaped profile. Using the mechanical drilling tool, the multiple adjacent holes may be drilled to a first depth.

At operation 535, the signal via hole is drilled, using a laser drilling tool, to increase the depth of the signal via hole. At operation 540, the multiple adjacent holes are drilled, using a laser drilling tool, to a second depth deeper than the first depth (e.g., the first depth drilled at operation 530). The laser drilling tool may have better tolerance control than the mechanical drilling tool so the final depth of the slot (e.g., the second depth) can be more precisely controlled.

At operation 550, a plating operation is performed to plate a wall of the signal via hole and a wall of the slot with metal plating. In some embodiments, both the walls of the signal via hole and the walls of the slot are plated during the same plating operation. In other embodiments, the walls of the signal via hole are plated separately from the walls of the slot. The metal plating can include a conductive metal plating as described herein above.

At operation 570, the plated signal via hole and the plated slot are at least partially filled with resin. The resin may be an epoxy resin, a polyimide resin, and/or an ink resin as described herein above. Filling the plated signal via hole and the plated slot with resin may reduce the number of voids in the PCB.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously, or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device, comprising:

a printed circuit board (PCB) comprising a first signal trace electrically coupled to a first signal via; and a slot ground configured to reduce signal interference with respect to the first signal via, wherein the slot ground comprises:

a slot formed in the PCB partially surrounding the first signal via, wherein the first signal trace extends outside the slot from the first signal via through an open portion formed in the slot, and wherein the slot extends uninterrupted from a top layer of the PCB above the first signal trace to a first intermediate layer of the PCB beneath the first signal trace;

metal plating on a wall of the slot, wherein the metal plating is electrically coupled to a ground plane of the PCB; and resin at least partially filling the slot.

2. The device of claim 1, wherein a central axis of the slot is substantially coaxial with a central axis of the first signal via.

3. The device of claim 1, wherein the PCB further comprises a second signal trace electrically coupled to a second signal via, and wherein the slot partially surrounds the first signal via and the second signal via.

4. The device of claim 1, wherein the first signal via is coupled to the first signal trace by a first signal pad disposed on a second intermediate layer of the PCB, and wherein the slot extends from the top layer of the PCB to the first intermediate layer of the PCB beneath the second intermediate layer.

5. The device of claim 4, wherein the first signal via extends from the top layer of the PCB to the second intermediate layer, and wherein at least an upper portion of the first signal via between the top layer and the second intermediate layer comprises metal plating.

6. The device of claim 5, wherein the first signal via further extends from the second intermediate layer to a bottom layer of the PCB, and wherein a lower portion of the first signal via between the second intermediate layer and the bottom layer lacks the metal plating.

7. The device of claim 5, wherein the first signal via intersects one or more non-functional pads disposed on one or more third intermediate layers of the PCB between the top layer and the second intermediate layer.

8. The device of claim 1, wherein the slot substantially forms a C-shaped profile.

9. The device of claim 1, further comprising one or more electrical components electrically coupled to the PCB.

10. A printed circuit board (PCB), comprising:

a first signal trace;

a first signal via electrically coupled to the first signal trace; and a slot ground configured to reduce signal interference with respect to the first signal via, wherein the slot ground comprises:

a slot formed in the PCB partially surrounding the first signal via, wherein the first signal trace extends outside the slot from the first signal via through an open portion formed in the slot, and wherein the slot extends uninterrupted from a top layer of the PCB above the first signal trace to a first intermediate layer of the PCB beneath the first signal trace;

metal plating on a wall of the slot, wherein the metal plating is electrically coupled to a ground plane of the PCB; and resin at least partially filling the slot.

11. The PCB of claim 10, further comprising:

a second signal trace; and a second signal via electrically coupled to the second signal trace, wherein the slot at least partially surrounds the first signal via and the second signal via.

12. The PCB of claim 10, further comprising:

a signal pad disposed on a first second intermediate layer of the PCB, wherein the slot extends from the top layer of the PCB to a second intermediate layer of the PCB beneath the second intermediate layer.

13. The PCB of claim 12, wherein the first signal via extends from the top layer of the PCB to the second intermediate layer, and wherein at least an upper portion of the first signal via between the top layer and the second intermediate layer comprises metal plating.

* * * * *